(12) United States Patent
Stagg (10) Patent No.: US 9,761,107 B2
(45) Date of Patent: Sep. 12, 2017

(54) MODULAR ALERT SYSTEM

(71) Applicant: Bradley Benjamin Stagg, Fort Mill, SC (US)

(72) Inventor: Bradley Benjamin Stagg, Fort Mill, SC (US)

(73) Assignee: White Stagg, LLC, Charlotte, NC (US)

( * ) Notice: Subject to any disclaimer, the term of this patent is extended or adjusted under 35 U.S.C. 154(b) by 0 days.

(21) Appl. No.: 15/295,266

(22) Filed: Oct. 17, 2016

(65) Prior Publication Data

US 2017/0032642 A1    Feb. 2, 2017

Related U.S. Application Data

(63) Continuation of application No. 14/578,754, filed on Dec. 22, 2014, now Pat. No. 9,501,925.

(60) Provisional application No. 61/920,255, filed on Dec. 23, 2013.

(51) Int. Cl.
| | |
|---|---|
| *H05K 7/00* | (2006.01) |
| *G08B 17/10* | (2006.01) |
| *G08B 25/08* | (2006.01) |
| *H05K 5/00* | (2006.01) |
| *H05K 7/02* | (2006.01) |

(52) U.S. Cl.
CPC .............. *G08B 17/10* (2013.01); *G08B 25/08* (2013.01); *H05K 5/0021* (2013.01); *H05K 7/026* (2013.01)

(58) Field of Classification Search
USPC ......... 361/728–730, 807, 809, 810; 340/500, 340/531, 539.1, 901
See application file for complete search history.

(56) References Cited

U.S. PATENT DOCUMENTS

| | | |
|---|---|---|
| 4,365,237 A | 12/1982 | Knight |
| 5,021,677 A | 6/1991 | Igarashi et al. |
| 5,969,627 A | 10/1999 | Tarlton et al. |
| 6,097,300 A | 8/2000 | Wei |
| 6,121,885 A | 9/2000 | Masone et al. |
| 6,160,487 A | 12/2000 | Deluca |
| 6,747,557 B1 | 6/2004 | Petite et al. |
| 6,778,091 B2 | 8/2004 | Qualey, III et al. |
| 7,336,165 B2 | 2/2008 | Fuchs |
| 7,522,063 B2 | 4/2009 | Ehlers |
| 7,714,733 B2 | 5/2010 | Farley et al. |
| 7,755,481 B2 | 7/2010 | Gayden |
| 7,782,191 B2 | 8/2010 | Flores |
| 7,872,573 B2 | 1/2011 | Lamb |
| 8,757,318 B2 | 6/2014 | Runciman et al. |
| 9,501,925 B2* | 11/2016 | Stagg ................. G08B 17/10 |

(Continued)

*Primary Examiner* — Hung S Bui (74) *Attorney, Agent, or Firm* — Seth L. Hudson; Clements Bernard Walker, PLLC (57) ABSTRACT

The present invention provides methods and systems for a modular alert system that includes at least two modules having a top portion and a bottom portion. The modules provide an alarm for one or more monitored conditions, and the bottom portion and the top portion of one module contains mating features. A mounting plate that has a top portion and a bottom portion contains mounting features, and the mounting features of the bottom portion correspond to the mounting features of the top portion of one module for forming a selectively secured arrangement. The system may also include at least one speaker housed within the module, and a smoke detector.

20 Claims, 6 Drawing Sheets

(56) References Cited

U.S. PATENT DOCUMENTS

| | | |
|---|---|---|
| 2005/0088311 A1 | 4/2005 | Deluca et al. |
| 2006/0050896 A1 | 3/2006 | Sung |
| 2008/0048873 A1 | 2/2008 | Araiza-Boys |
| 2008/0055097 A1 | 3/2008 | Chidakel et al. |
| 2009/0237260 A1 | 9/2009 | Bradley, Jr. et al. |

* cited by examiner

MODULAR ALERT SYSTEM

CROSS REFERENCE TO RELATED PATENT APPLICATION

The present patent application/patent is a continuation of U.S. patent application Ser. No. 14/578,754 filed on Dec. 22, 2014 titled "MODULAR ALERT SYSTEM", which claims the benefit of the earlier priority filing of provisional application Ser. No. 61/920,255 that was filed on Dec. 23, 2013, the contents of which are incorporate in full by reference herein.

FIELD OF THE INVENTION

The present invention relates generally to a modular alert system, and more generally relates to an alert system with at least one module for monitoring alarm conditions and generating an auditory, visual, or other stimuli if a condition is met.

BACKGROUND OF THE INVENTION

A smoke detector generally comprises, for example, a base secured to a ceiling or the like, a detector body removably set to the bottom of the base, and an outer cover for covering the face (bottom) opposite to the base of the detector body.

The detector body comprises a circuit part comprising a printed circuit board on which electronic parts serving as a fire detecting circuit are mounted, a detecting part serving as a sensor for detecting smoke, and a body to which the circuit part and the detecting part are secured and which is removably set to the base. The detector may be based upon either an ionization or photoelectric detection.

The present invention allows at least one module to be selectively secured to a smoke detector for forming a more complete and expansive warning alert system. In addition to detecting the presence of smoke, a module could be added to detect adverse weather conditions or carbon monoxide. The present invention solves this problem and allows for the monitoring of alarm conditions and generating an auditory, visual, or other stimuli if a condition is met.

BRIEF SUMMARY OF THE INVENTION

According to an embodiment of the present invention, a modular alert system includes at least two modules having a top portion and a bottom portion. At least one module provides an alarm for one or more monitored conditions, and the bottom portion and the top portion of the at least one module contains mating features. A mounting plate that has a top portion and a bottom portion contains mounting features, and the mounting features of the bottom portion correspond to the mounting features of the top portion of one module for forming a selectively secured arrangement. The system may also include at least one speaker housed within the module, and a cover plate disposed on the bottom portion of one module.

According to yet another embodiment of the present invention, the modular alert system includes at least three modules.

According to yet another embodiment of the present invention, the modular alert system includes two speakers housed within one module.

According to yet another embodiment of the present invention, the modular alert system includes a module that transmits weather alert information and contains a keypad, display screen, and backup battery.

According to yet another embodiment of the present invention, the modular alert system includes a smoke detector engaged to the bottom portion of tone module and communicatively coupled to one module.

According to yet another embodiment of the present invention, the modular alert system includes an adaptor plate that contains a centrally located bore and four spaced-apart tabs.

According to yet another embodiment of the present invention, the modular alert system includes at least two modules having a top portion and a bottom portion. The at least one module provides an alarm for one or more monitored conditions, and the bottom portion and the top portion of the at least one module contains mating features. A mounting plate that has a top portion and a bottom portion contains mounting features, and the mounting features of the bottom portion correspond to the mounting features of the top portion of the module for forming a selectively secured arrangement. The system may also include at least one speaker housed within the module, and a smoke detector.

According to yet another embodiment of the present invention, the modular alert system includes an upper adaptor plate having a top portion and a bottom portion and a mounting plate having a top portion and a bottom portion. The bottom portion of the adaptor plate being engaged to the top portion of the at least one module and the top portion of the adaptor plate engaged to the bottom portion of the mounting plate.

According to yet another embodiment of the present invention, the modular alert system includes a lower adaptor plate engaged to the bottom portion of at least one module and the smoke detector engaged to the lower adaptor plate.

According to yet another embodiment of the present invention, the modular alert system includes at least one module engaged to a module power plug and a cable assembly connects the smoke alarm to the module power plug.

According to yet another embodiment of the present invention, the modular alert system includes a first module and a second module, wherein the first module contains a module power receptacle that is engaged to a module power plug, the second module contains a module power receptacle that is engaged to a module power plug, a cable assembly connects the module power plug engaged to the first module with the module power plug engaged to the second module.

According to yet another embodiment of the present invention, the modular alert system includes a plug adaptor engaged to a cable assembly and modular power plug for supplying power to the at least one module and smoke alarm.

According to yet another embodiment of the present invention, a method for monitoring an alarm condition that includes providing at least one module having a top portion and a bottom portion, a smoke detector having a top portion and a bottom portion, an upper adaptor plate having a top portion and a bottom portion, a lower adaptor plate having a top portion and a bottom portion, and a mounting plate having a top portion and a bottom portion. The top portion of the mounting plate is mounted to a fixed surface, and the top portion of the upper adaptor plate is engaged to the bottom portion of the mounting plate. The top portion of the module is engaged to the bottom portion of the upper adaptor plate. The bottom portion of the module is engaged to the upper portion of the lower adaptor plate. The top portion of the smoke detector is engaged to the bottom portion of the lower adaptor plate.

According to yet another embodiment of the present invention, a method for monitoring an alarm condition that includes at least one speaker within the at least one module.

According to yet another embodiment of the present invention, a method for monitoring an alarm condition that includes a weather alert module containing a back-up battery and display screen.

According to yet another embodiment of the present invention, a method for monitoring an alarm condition that includes detecting smoke by the smoke detector and transmitting a detection signal to the at least module and producing sound through a speaker to provide a signal.

According to yet another embodiment of the present invention, a method for monitoring an alarm condition that includes detecting a severe weather warning and transmitting and broadcasting the weather alert through a speaker.

According to yet another embodiment of the present invention, a method for monitoring an alarm condition that includes providing at least one peripheral control unit operationally connected to at least one module via a wireless connection.

BRIEF DESCRIPTION OF THE DRAWINGS

The present invention is illustrated and described herein with reference to the various drawings, in which like reference numbers denote like method steps and/or system components, respectively, and in which.

DETAILED DESCRIPTION OF THE INVENTION

The present invention may be understood more readily by reference to the following detailed description of the invention taken in connection with the accompanying drawing figures, which form a part of this disclosure. It is to be understood that this invention is not limited to the specific devices, methods, conditions or parameters described and/or shown herein, and that the terminology used herein is for the purpose of describing particular embodiments by way of example only and is not intended to be limiting of the claimed invention. Any and all patents and other publications identified in this specification are incorporated by reference as though fully set forth herein.

Also, as used in the specification including the appended claims, the singular forms "a," "an," and "the" include the plural, and reference to a particular numerical value includes at least that particular value, unless the context clearly dictates otherwise. Ranges may be expressed herein as from "about" or "approximately" one particular value and/or to "about" or "approximately" another particular value. When such a range is expressed, another embodiment includes from the one particular value and/or to the other particular value. Similarly, when values are expressed as approximations, by use of the antecedent "about," it will be understood that the particular value forms another embodiment.

Figure 1:
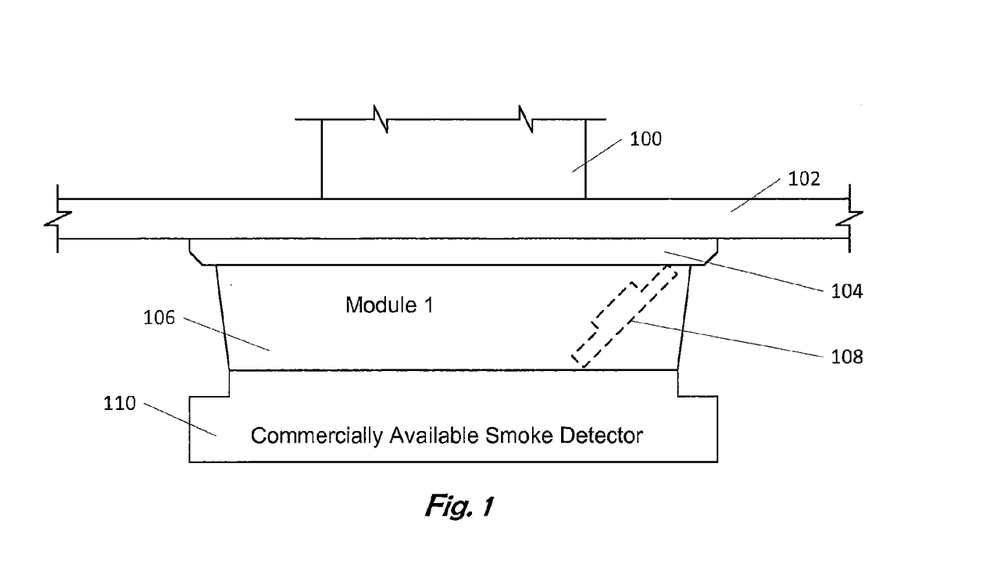
FIG. 1 illustrates a side-view of a modular alert system in accordance with the present invention.

Referring now specifically to the drawings, a modular alert system is illustrated in FIG. 1 for providing an alarm for one monitored condition with a single module 106. The modular alert system includes a smoke detector 110, a module 106, and a mounting plate 104. The smoke detector 110 has a top portion and a bottom portion. The top portion of the smoke detector 110 is engaged to a bottom portion of the module 106 and the top portion of the module 106 is engaged to the bottom portion of the mounting plate 104. The top portion of the mounting plate 104 is engaged to a first side of a mounting surface 102. An electrical junction box 100 is engaged in close proximity to the second side of the mounting surface 102.

The mounting surface 102 may be a drywall panel, as typically found in many residences, or can be any other substrate forming an interior ceiling or wall of a residence or commercial building. The electrical junction box 100 may be engaged and supported by a stud/joist in close proximity to the second side of the mounting surface 102. The module 106 may also include at least one audio speaker 108 that transmits an auditory sound when the smoke detector 110 detects a condition.

The modular alert system may contain one or more modules along with various combinations of additional elements that attach to each other to assemble various modular alert systems. Each module contains components that detect the presence of one or more monitored alarm conditions and generate the required auditory, visual, or other stimuli. The monitored conditions of each module can consist of carbon monoxide detection, adverse weather detection, and/or smoke detection. For embodiments that generate auditory stimuli, each module comprises at least one speaker for producing an auditory signal. Additionally, for embodiments that generate auditory stimuli, each module may have elements positioned in close proximity to the speakers to manipulate the sound dispersion of the speaker(s).

The modules may be operationally connected to one or more peripheral control units via a wired or wireless connection. The peripheral control unit can be a custom device for configuring, controlling, and monitoring a module. In another exemplary embodiment, the peripheral control unit may be a general purpose or mobile computing device. Examples of such general purpose or mobile computing devices are including, but not limited to, personal computers, mobile phones, laptop computers, and tablet computers. For example, the smoke alarm signal can be muted remotely by using a cell phone, PC, tablet, or the like. The modules may also be configured using an app or web interface based upon a physical location to receive specific weather alerts based upon a specific location.

The modules may operationally connect to one or more peripheral alert units. These peripheral alert units are a custom device for monitoring alert or status information. Alternatively, the peripheral alert unit may be an additional module. The peripheral alert unit may be a general purpose or mobile computing device. Examples of such general purpose or mobile computing devices are including, but not limited to, personal computers, mobile phones, laptop computers, and tablet computers.

Figure 2:
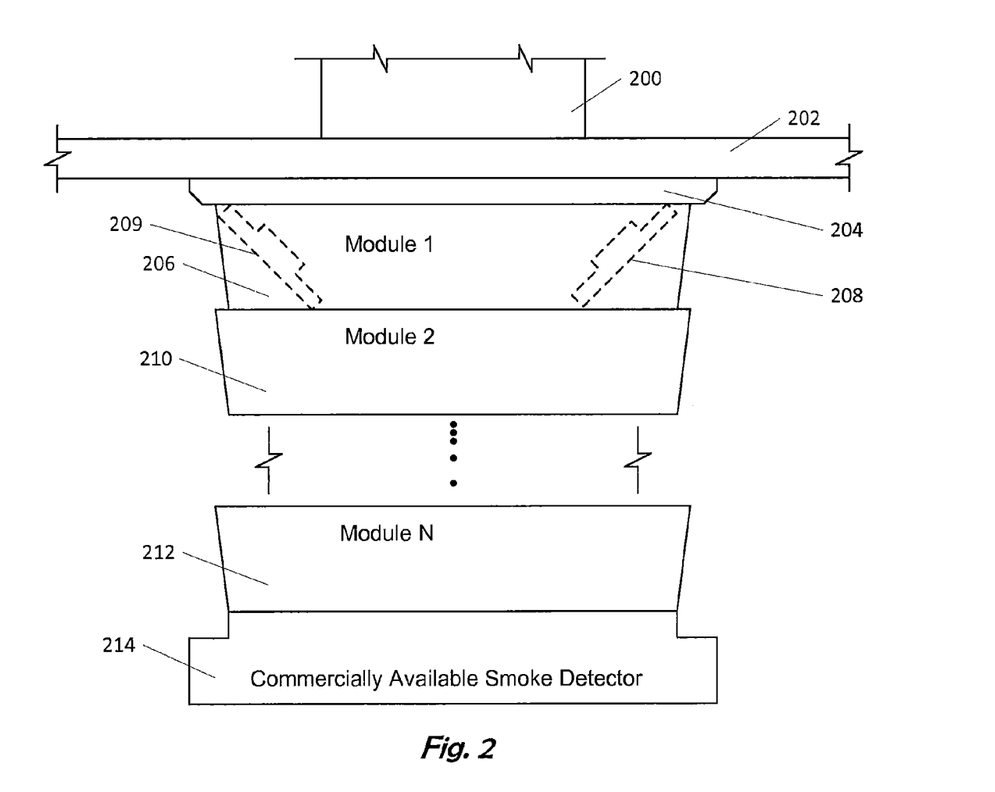
FIG. 2 illustrates a side-view of the modular alert system with a plurality of modules in accordance with the present invention.

FIG. 2 illustrates an alternative embodiment of a modular alert system. The modular alert system includes a first module 206, a second module 210, at least one other module 212, a mounting plate 204, and a smoke detector 214. The first module 206 provides an alarm for a first monitored condition, the second module 210 provides an alarm for a second monitored condition, and the at least one other module 212 provides an alarm for at least a third monitored condition. A smoke detector 214 is selectively engaged to the bottom portion of the at least one other module 212. The top portion of the at least one other module 212 is selectively engaged to the bottom portion of the second module 210. The top portion of the second module 210 is selectively engaged to the bottom portion of the first module 206. The top portion of the first module 206 is selectively engaged to the bottom portion of the mounting plate 204. The top portion of the mounting plate 204 is selectively engaged to a first side of a mounting surface 202. An electrical junction box 200 is engaged in close proximity to the second side of the mounting surface 202. At least one audio speaker 208 is enclosed within the first module 206 that transmits an auditory sound when the smoke detector 214 detects a condition. As illustrated in FIG. 2, the first module 206 includes two, spaced apart speakers 208, 209 disposed on opposite side of the first module 206.

Figure 7:
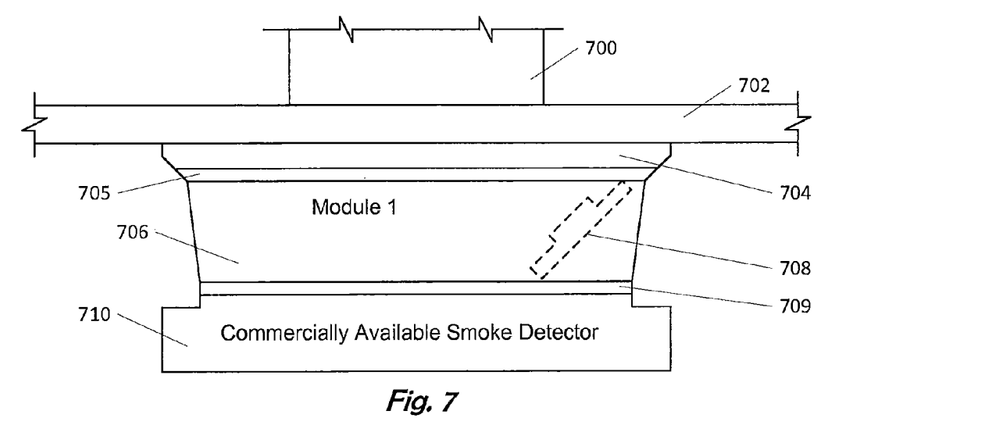
FIG. 7 is a side-view of an additional embodiment of the present invention that includes a single module with two adapter plates.

Another alternative embodiment of the modular alert system is illustrated in FIG. 7. This embodiment includes a smoke detector 710, a lower adaptor plate 709, a module 706, an upper adaptor plate 705, and a mounting plate 704. The top portion of the smoke detector 710 is selectively engaged to the bottom portion of the lower adaptor plate 709. The upper portion of the lower adaptor plate 709 is selectively engaged to the bottom portion of the module 706. The top portion of the module 706 is selectively engaged to the bottom portion of the upper adaptor plate 705, and the top portion of the upper adaptor plate 705 is selectively engaged to the bottom portion of the mounting plate 704. The top portion of the mounting plate 704 is selectively engaged to a first side of a mounting surface 702. An electrical junction box 700 is selectively engaged in close proximity to the second side of the mounting surface 702. At least one audio speaker 708 is enclosed within the first module 706 that transmits an auditory sound when the smoke detector 710 detects a condition. The adaptor plates 709 and 705 are optional.

Figure 8:
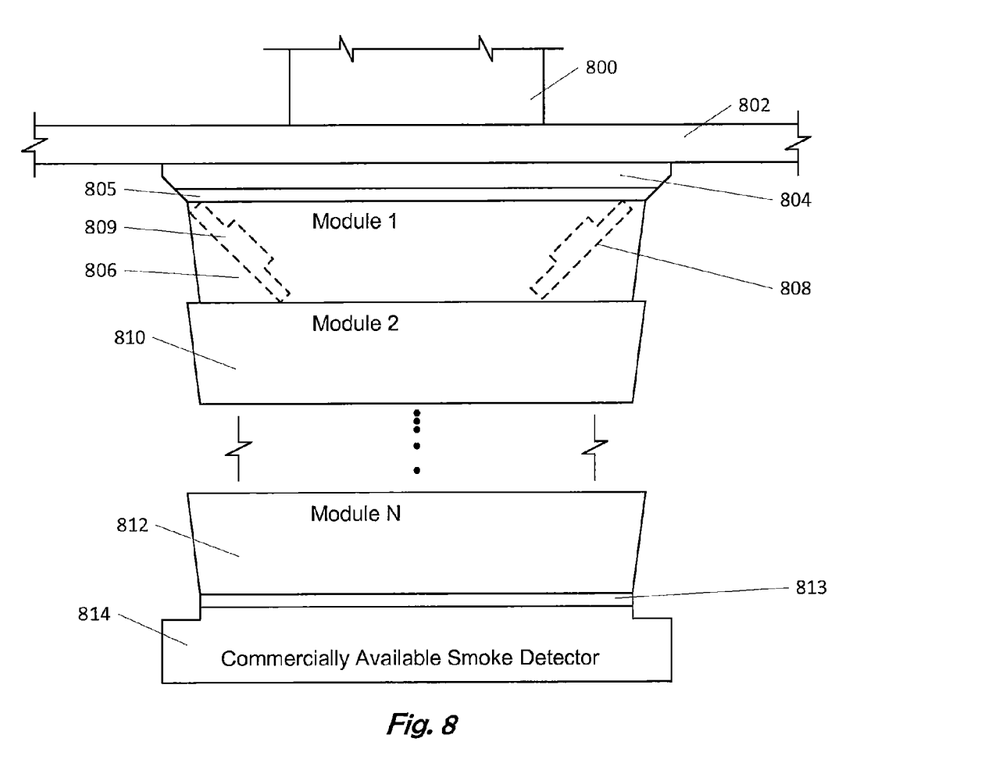
FIG. 8 is a side-view of an additional embodiment of the present invention that includes a plurality of modules with two adaptor plates.

Another alternative embodiment of the modular alert system is illustrated in FIG. 8. This embodiment includes a smoke detector 814, an upper adaptor plate 805, a first module 806, a second module 810, a mounting plate 804, a lower adaptor plate 813, and at least one other module 812. The top portion of the smoke detector 814 is selectively engaged to the bottom portion of the lower adaptor plate 813. The top portion of the lower adaptor plate 813 is selectively engaged to the bottom portion of the at least one other module 812. The top portion of the at least one other module 821 is selectively engaged to the bottom portion of the second module 810, and the top portion of the second module 810 is selectively engaged to the bottom portion of the first module 806. The top portion of the first module 806 is selectively engaged to the bottom portion of the upper adaptor plate 805. The top portion of the upper adaptor plate 805 is selectively engaged to the bottom portion of the mounting plate 804. The top portion of the mounting plate 804 is selectively engaged to a first side of a mounting surface 802. An electrical junction box 800 is selectively engaged in close proximity to the second side of the mounting surface 802. At least one audio speaker 808 is enclosed within the first module 806 that transmits an auditory sound when the smoke detector 814 detects a condition. As illustrated in FIG. 8, the first module 806 includes two, spaced apart speakers 808, 809 disposed on opposite side of the first module 806. The adaptor plates 805 and 813 are optional.

Figure 3:
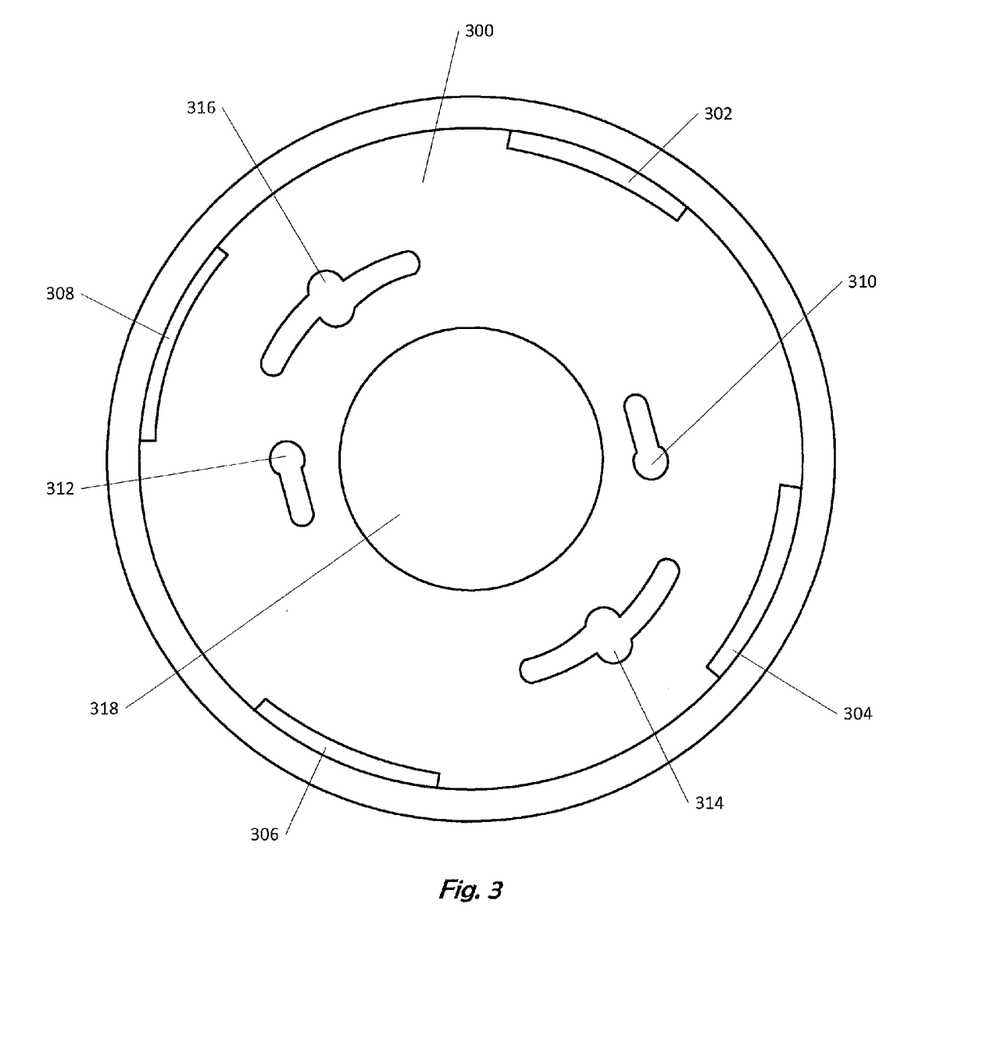
FIG. 3 is a top view of a baseplate in accordance with the present invention.

An exemplary mounting plate 300 is illustrated in FIG. 3. The mounting plate 300 is generally circular in shape having a centrally disposed bore 318. A generally circular cavity circumscribes the centrally disposed bore 318 and extends outward to an outer edge. A rim extends upwardly from the outer edge creating a rim/outer edge intersection. At least one tab 302 is disposed adjacent the rim and cavity. As illustrated in FIG. 3, four tabs (302, 304, 306, and 308) are spaced apart, an equal distance around the mounting plate 300. The tabs (302, 304, 306, and 308) are disposed adjacent the rim and cavity intersection. The tabs may have multiple sizes, dimension, and variations.

The mounting plate 300 includes two pairs of slots (310, 312, 314, 316) disposed within the cavity. The first pair of slots 310, 312 are disposed on opposite sides of the central bore 318 and consist of a longitudinal portion that ends in a generally circular portion. The first pair of slots 310, 312 are arranged in opposite directions on either side of the central bore 318. The second pair of slots 314, 316 are disposed on opposite sides of the central bore 318 and consist of a longitudinal portion on either side of a generally circular portion. In other words, the longitudinal portion extends from either side of the generally circular portion.

Figure 4:
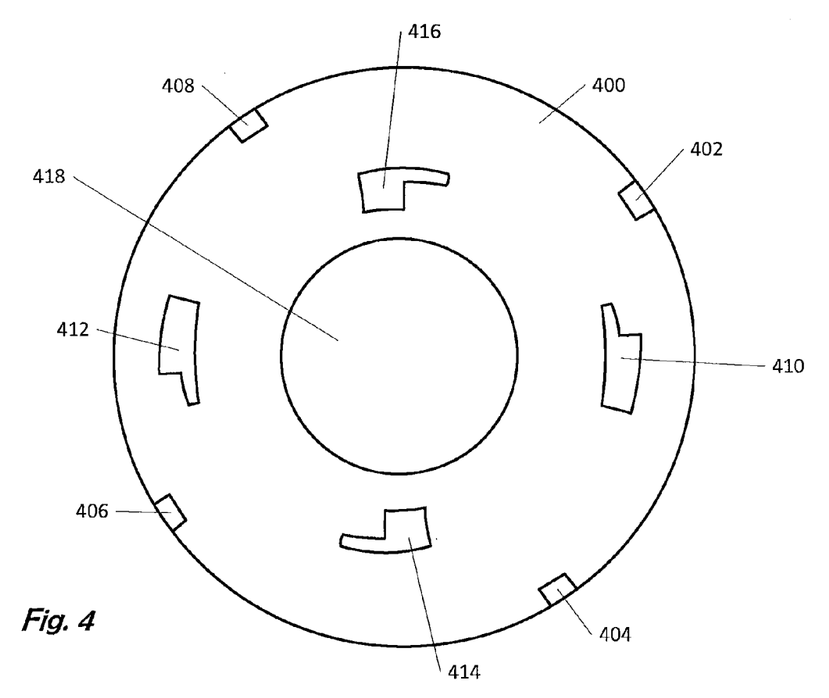
FIG. 4 is a top view of an adaptor plate in accordance with the present invention.

An adaptor plate 400 according to the present invention is illustrated in FIG. 4 and is generally circular. The adaptor plate 400 contains at least one tab. A centrally disposed bore 418 is contained within the adaptor plate 400 and the body of the adaptor plate 400 extends outward from the centrally disposed bore 418 to an outer edge. As illustrated in FIG. 4, four tabs (402, 404, 406, and 408) are spaced apart, an equal distance around the adaptor plate 400. The tabs (402, 404, 406, and 408) are disposed adjacent the outer rim of the adaptor plate 400. The tabs (402, 404, 406, and 408) rotatably attach the adaptor plate 400 to the mounting plate 300. The tabs (402, 404, 406, and 408) correspond with the tabs (302, 304, 306, and 308) of the mounting plate 300 for forming a selectively secured, rotatably secured arrangement. The mounting plate 300 is mounted to a surface and the adaptor plate 400 is engaged to the mounting plate 300 and rotated. During this rotation, the tabs (402, 404, 406, and 408) of the adaptor plate 400 slid underneath the tabs (302, 304, 306, and 308) of the mounting plate 300, selectively securing the adaptor plate 400 to the mounting plate 400.

The adaptor plate 400 may also include keys (410, 412, 414, and 416). The keys (410, 412, 414, and 416) contain an elongate portion that proceeds to a generally square (414, 416) or generally rectangular (410, 412) portion. These keys are used to selectively secure the adaptor plate 400 to some commercially available mounting plates. The keys (410, 412, 414, and 416) correspond to keys found on the commercially available mounting plates for forming a selectively secured arrangement.

Figure 5:
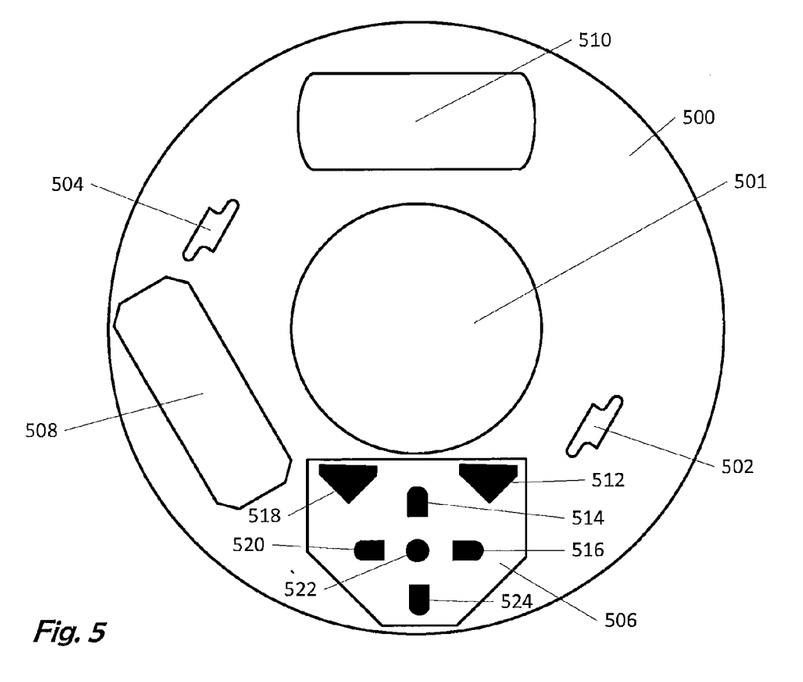
FIG. 5 is a bottom view of a module enclosure in accordance with the present invention.

An exemplary module 500 is shown in FIG. 5. This module 500 implements weather alert functionality. The module 500 is configured by the user through use of the keypad 506 having buttons 512, 514, 516, 518, 520, 522, 524 to assist in navigating through a configuration menu displayed on the LCD 510. The buttons 512, 514, 516, 518, 520, 522, and 524 allow the user to initially configure the module 500, including setting alert types to be relayed or ignored and the geographic location via a S.A.M.E. (Specific Area Message Encoding) Code. In an alternative embodiment of the present invention, there are no buttons that exist and the modules are configured via and app or web interface. The module 500 would be hardwired, but a backup battery 508 is included to provide power in case of a power outage. Keys 502 and 504 may also be included that provision attachment to an adaptor plate 400. The keys 502, 504 correspond to keys 410, 412, 414, and 416 of the adaptor plate 400 for forming a selectively secured arrangement.

Figure 6:
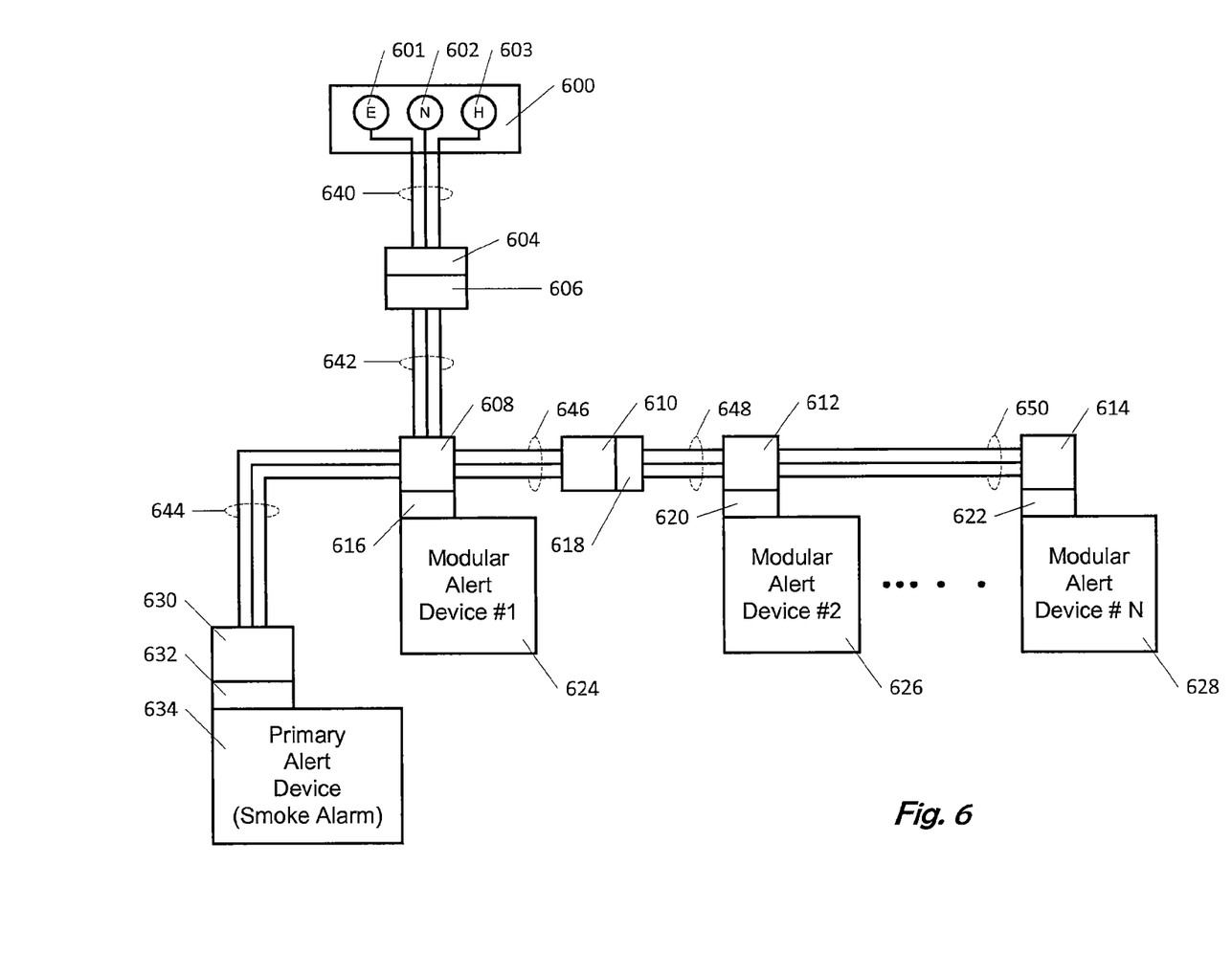
FIG. 6 is a circuit diagram illustrating an exemplary power distribution cable harness connectivity in accordance with the present invention.

FIG. 6 shows an exemplary wiring diagram for an exemplary modular alert system of the present invention. In this example, an alternating current power source is available at the junction box 600 through a power outlet. A wiring harness is connected to the junction box by a cable assembly 640 to the alternating current wiring 601, 602, and 603 and the cable assembly 640 is terminated by a power plug 604 that in the embodiments is a connector provided with the smoke detector. A plug adaptor 606 mates with the power plug 604 to connect the cable assembly 642, which terminates in a module power plug 608. The module power plug 608 mates with a corresponding module power receptacle 616. The module power plug 608 also terminates cable assembly 644 on one end, while the other end is an adaptor compatible with the connector on the primary alert device 634, such as a smoke detector. Module power plug 608 also terminates cable assembly 646 on one end, while the other end terminates in another module power plug 610. The cable assemblies 648 and 650 are terminated with module power receptacle 618 and module power plugs 612 and 614 respectively, which mate to their corresponding module power receptacles 620 and 622 which provide power to modules 626, 628. The components 618, 648, 612, 650, and 614 comprise a wiring harness extender, which can have additional cable assemblies and module power plugs added to accommodate additional modules. The centrally located bores (318, 418) of the mounting plate 300 and adaptor plate 400 allows the wiring harnesses to be inserted through the mounting plate 300 and adaptor plate 400.

Figure 9:
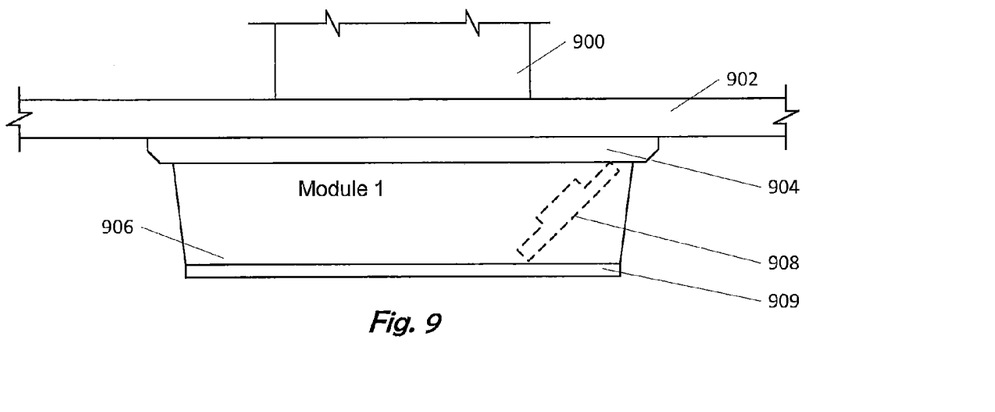
FIG. 9 is a side-view of an additional embodiment of a modular alert system of the present invention that includes a cover plate.
Figure 10:
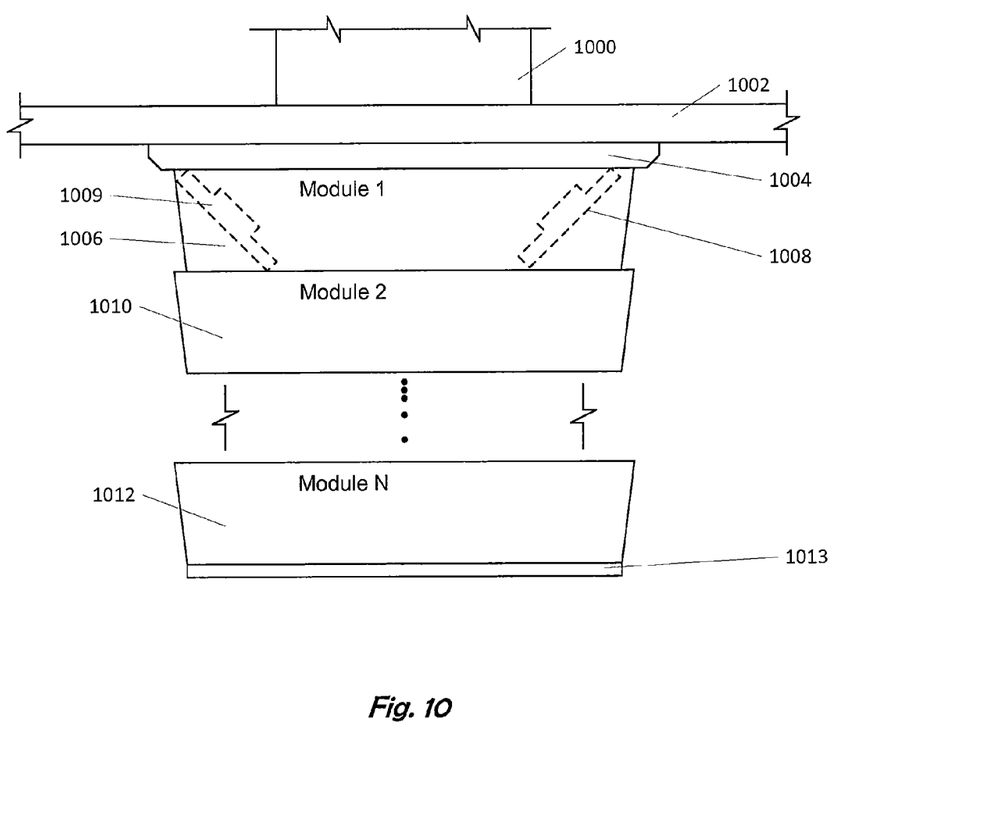
FIG. 10 is a side-view of an additional embodiment of a modular alert system of the present invention that includes a plurality of modules and a cover plate.

A cover plate 909, 1013 as illustrated in FIGS. 9 and 10 may be included. As shown in FIG. 9, the cover plate 909 is engaged to the bottom portion of the module 906. In FIG. 10, the cover plate 1013 is engaged to the bottom of the at least one additional module 1012.

Although the present invention has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present invention and are intended to be covered by the following claims.

What is claimed is:

1. A modular alert system, comprising:
    at least two modules having a top portion and a bottom portion, the modules provide an alarm for one or more monitored conditions, the bottom portion and the top portion of the modules contains mating features;
    a mounting plate having a top portion and a bottom portion with mounting features, the mounting features of the bottom portion correspond to the mounting features of the top portion of one of the modules for forming a selectively secured arrangement;
    at least two speakers housed within one module;
    a cover plate disposed on the bottom portion of one module.

2. The modular alert system according to claim 1, further comprising at least three modules.

3. The modular alert system according to claim 1, further comprising two speakers housed within the module.

4. The modular alert system according to claim 1, wherein the module transmits weather alert information and contains a keypad, display screen, and backup battery.

5. The modular alert system according to claim 1, further comprising a smoke detector engaged to the bottom portion of the module and communicatively coupled to one module.

6. The modular alert system according to claim 1, further including an adaptor plate that contains a centrally located bore and four spaced-apart tabs.

7. A modular alert system, comprising:
    at least two modules having a top portion and a bottom portion, one module provides an alarm for one or more monitored conditions, the bottom portion and the top portion of the module contains mating features;
    a mounting plate having a top portion and a bottom portion with mounting features, the mounting features of the bottom portion correspond to the mounting features of the top portion of the module for forming a selectively secured arrangement;
    at least one speaker housed within the module;
    a smoke detector; and
    a peripheral alert system.

8. The modular alert system according to claim 7, further comprising an upper adaptor plate having a top portion and a bottom portion and a mounting plate having a top portion and a bottom portion, the bottom portion of the adaptor plate being engaged to the top portion of one module and the top portion of the adaptor plate engaged to the bottom portion of the mounting plate.

9. The modular alert system according to claim 7, further comprising a lower adaptor plate engaged to the bottom portion of one module and the smoke detector engaged to the lower adaptor plate.

10. The modular alert system according to claim 7, further comprising two speakers housed within the module.

11. The modular alert system according to claim 7, wherein the smoke detector is engaged to the bottom portion of one module.

12. The modular alert system according to claim 7, wherein one module is engaged to a module power plug and a cable assembly connects the smoke alarm to the module power plug.

13. The modular alert system according to claim 7, further comprising a first module and a second module, wherein the first module contains a module power receptacle that is engaged to a module power plug, the second module contains a module power receptacle that is engaged to a module power plug, a cable assembly connects the module power plug engaged to the first module with the module power plug engaged to the second module.

14. The modular alert system according to claim 7, further comprising a plug adaptor engaged to a cable assembly and modular power plug for supplying power to one module and smoke alarm.

15. A method for monitoring an alarm condition, comprising:
providing at least two modules having a top portion and a bottom portion, a smoke detector having a top portion and a bottom portion, an upper adaptor plate having a top portion and a bottom portion, a lower adaptor plate having a top portion and a bottom portion, a mounting plate having a top portion and a bottom portion, and a peripheral alert system;
mounting the top portion of the mounting plate to a fixed surface;
engaging the top portion of the upper adaptor plate to the bottom portion of the mounting plate;
engaging the top portion of the module to the bottom portion of the upper adaptor plate;
engaging the bottom portion of the module to the upper portion of the lower adaptor plate; and
engaging the top portion of the smoke detector to the bottom portion of the lower adaptor plate.

16. The method of monitoring an alarm condition according to claim 15, further comprising at least one speaker within the at least one module.

17. The method of monitoring an alarm condition according to claim 15, further comprising a weather alert module containing a back-up battery and display screen.

18. The method of monitoring an alarm condition according to claim 15, further comprising detecting smoke by the smoke detector and transmitting a detection signal to the at least module and producing sound through a speaker to provide a signal.

19. The method of monitoring an alarm condition according to claim 15, further comprising detecting a severe weather warning and transmitting and broadcasting the weather alert through a speaker.

20. The method of monitoring an alarm condition according to claim 15, further comprising providing at least one peripheral control unit operationally connected to the at least one module via a wireless connection.

* * * * *

UNITED STATES PATENT AND TRADEMARK OFFICE
CERTIFICATE OF CORRECTION

PATENT NO. : 9,761,107 B2  
APPLICATION NO. : 15/295266  
DATED : September 12, 2017  
INVENTOR(S) : Bradley Benjamin Stagg et al.

Page 1 of 1

It is certified that error appears in the above-identified patent and that said Letters Patent is hereby corrected as shown below:

On the Title Page

Column 1, item (63) Related U.S. Application Data:  
Change "Continuation of application No. 14/578,754, filed on Dec. 22, 2014, now Pat. No. 9,501,925." to This application is a continuation of 14/578,754, filed on Dec. 22, 2014, now Pat. No. 9,501,925 which claims benefit to provisional application No. 61/920,255, filed on Dec. 23, 2013.

Column 1, item (60) Related U.S. Application Data:  
Delete "Provisional application No. 61/920,555, filed on Dec. 23, 2013."

Signed and Sealed this  
Seventeenth Day of October, 2017

Joseph Matal  
*Performing the Functions and Duties of the*  
*Under Secretary of Commerce for Intellectual Property and*  
*Director of the United States Patent and Trademark Office*